(12) United States Patent
Camayd-Munoz et al.

(10) Patent No.: US 12,216,290 B2
(45) Date of Patent: Feb. 4, 2025

(54) COLOR AND MULTI-SPECTRAL IMAGE SENSOR BASED ON 3D ENGINEERED MATERIAL

(71) Applicant: CALIFORNIA INSTITUTE OF TECHNOLOGY, Pasadena, CA (US)

(72) Inventors: Philip Camayd-Munoz, Pasadena, CA (US); Conner Ballew, Pasadena, CA (US); Gregory Roberts, Pasadena, CA (US); Andrei Faraon, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 17/853,540

(22) Filed: Jun. 29, 2022

(65) Prior Publication Data

US 2023/0122182 A1   Apr. 20, 2023

Related U.S. Application Data

(62) Division of application No. 16/656,156, filed on Oct. 17, 2019, now Pat. No. 11,397,331.
(Continued)

(51) Int. Cl.
*G02B 27/10*   (2006.01)
*G02B 5/02*    (2006.01)
(Continued)

(52) U.S. Cl.
CPC ....... *G02B 27/1013* (2013.01); *G02B 5/0236* (2013.01); *H01L 27/14625* (2013.01);
(Continued)

(58) Field of Classification Search
CPC .............. G02B 27/1013; G02B 5/0236; H01L 27/14625; H01L 27/14645; H01L 27/14685; H01P 1/207
See application file for complete search history.

(56) References Cited

U.S. PATENT DOCUMENTS

| 5,385,114 A | 1/1995 | Milstein et al. |
| 6,991,334 B2 | 1/2006 | Okuyama et al. |

(Continued)

FOREIGN PATENT DOCUMENTS

| CN | 1635662 A | 7/2005 |
| CN | 101044631 A | 9/2007 |

(Continued)

OTHER PUBLICATIONS

Applied Optics, vol. 40, No. 31, Nov. 2001 (Year: 2001).*
(Continued)

*Primary Examiner* — Dzung Tran
(74) *Attorney, Agent, or Firm* — Steinfl + Bruno LLP

(57) ABSTRACT

Methods and devices to build and use multi-functional scattering structures. The disclosed methods and devices account for multiple target functions and can be implemented using fabrication methods based on two-photon polymerization or multi-layer lithography. Exemplary devices functioning as wave splitters are also described. Results confirming the performance and benefits of the disclosed teachings are also described.

10 Claims, 17 Drawing Sheets

Related U.S. Application Data

(60) Provisional application No. 62/776,685, filed on Dec. 7, 2018, provisional application No. 62/748,677, filed on Oct. 22, 2018.

(51) Int. Cl.
  *H01L 27/146* (2006.01)
  *H01P 1/207* (2006.01)

(52) U.S. Cl.
  CPC .. *H01L 27/14645* (2013.01); *H01L 27/14685* (2013.01); *H01P 1/207* (2013.01)

(56) References Cited

U.S. PATENT DOCUMENTS

| | | | |
|---|---|---|---|
| 8,002,998 | B2 | 8/2011 | Iwata et al. |
| 9,159,761 | B2 | 10/2015 | Kokubun |
| 9,207,357 | B2 | 12/2015 | Steinhardt et al. |
| 11,397,331 | B2 | 7/2022 | Camayd-Munoz et al. |
| 2003/0118799 | A1 | 6/2003 | Miller et al. |
| 2005/0234220 | A1* | 10/2005 | Koga ............ C08J 7/06 528/481 |
| 2005/0237134 | A1 | 10/2005 | Furuya et al. |
| 2006/0113622 | A1 | 6/2006 | Adkisson et al. |
| 2008/0047928 | A1 | 2/2008 | Iwata et al. |
| 2008/0157140 | A1 | 7/2008 | Cho |
| 2009/0052019 | A1* | 2/2009 | Brueck ............ G02B 21/367 359/370 |
| 2010/0033818 | A1 | 2/2010 | Petcavich et al. |
| 2010/0148283 | A1 | 6/2010 | Shih |
| 2011/0237892 | A1 | 9/2011 | Tearney et al. |
| 2011/0285942 | A1 | 11/2011 | Guo et al. |
| 2012/0092770 | A1* | 4/2012 | Li ............ G02B 5/1809 359/569 |
| 2013/0099343 | A1 | 4/2013 | Toshikiyo et al. |
| 2013/0208360 | A1 | 8/2013 | Coggio et al. |
| 2014/0085693 | A1 | 3/2014 | Mosallaei et al. |
| 2014/0092373 | A1 | 4/2014 | Tabirian et al. |
| 2014/0270374 | A1* | 9/2014 | Unzueta ............ G06V 40/171 382/103 |
| 2014/0293467 | A1 | 10/2014 | Palikaras et al. |
| 2014/0339606 | A1 | 11/2014 | Lin et al. |
| 2016/0206184 | A1 | 7/2016 | Tearney et al. |
| 2017/0069678 | A1 | 3/2017 | Cheng et al. |
| 2017/0146856 | A1 | 5/2017 | Yokota |
| 2017/0373700 | A1* | 12/2017 | Lu ............ C12N 5/10 |
| 2018/0045953 | A1* | 2/2018 | Fan ............ G02B 1/002 |
| 2020/0124866 | A1 | 4/2020 | Camayd-Munoz et al. |
| 2021/0190593 | A1 | 6/2021 | Yao et al. |
| 2021/0286188 | A1 | 9/2021 | Rubin et al. |
| 2022/0214219 | A1 | 7/2022 | Faraon et al. |
| 2023/0207592 | A1 | 6/2023 | Watanabe et al. |

FOREIGN PATENT DOCUMENTS

| | | |
|---|---|---|
| CN | 102870018 A | 1/2013 |
| CN | 103154777 A | 6/2013 |
| CN | 204481029 U | 7/2015 |
| CN | 107664780 A | 2/2018 |
| CN | 109545812 A | 3/2019 |
| CN | 111684581 A | 9/2020 |
| CN | 114556166 A | 5/2022 |
| CN | 116344564 A | 6/2023 |
| EP | 3195048 B1 | 11/2021 |
| JP | 2004219998 A | 8/2004 |
| JP | 2005084290 A | 3/2005 |
| JP | 2008052108 A | 3/2008 |
| JP | 2009510391 A | 3/2009 |
| JP | 2011527930 A | 11/2011 |
| JP | 2011530403 A | 12/2011 |
| JP | 2012015424 A | 1/2012 |
| JP | 2012530945 A | 12/2012 |
| JP | 2014534459 A | 12/2014 |
| JP | 2015087431 A | 5/2015 |
| JP | 2015194637 A | 11/2015 |
| JP | 2017538974 A | 12/2017 |
| JP | 2021521481 A | 8/2021 |
| JP | 2022503657 A | 1/2022 |
| JP | 7069265 B2 | 5/2022 |
| JP | 2022110029 A | 7/2022 |
| KR | 20080061029 A | 7/2008 |
| KR | 20220083736 A | 6/2022 |
| WO | 2004/059784 A1 | 7/2004 |
| WO | 2007/008440 A2 | 1/2007 |
| WO | 2008/113978 A1 | 9/2008 |
| WO | 2010/017503 A1 | 2/2010 |
| WO | 2016/086204 A1 | 6/2016 |
| WO | 2019/108945 A1 | 6/2019 |
| WO | 2019/113106 A1 | 6/2019 |
| WO | 2019/203926 A1 | 10/2019 |
| WO | 2021/076154 A1 | 4/2021 |

OTHER PUBLICATIONS

European Examination Report for European Application No. 19909195.0 filed on May 20, 2021 on behalf of California Institute of Technology. Mail Date: Jun. 5, 2023. 4 Pages.

Nersisyan, S. R. "Characterization of optically imprinted polarization gratings," Appl. Opt. 48, 4062-4067 (2009).

Notice of Reasons for Refusal issued for Japanese Patent Applicaiton No. 2022-515969 filed on Oct. 18, 2019 on behalf of California Institute of Technology. Dispatch Date: Aug. 8, 2023. 15 pages.

Notice To File A Response issued for KR Application No. 10-2021-7009690 filed on Apr. 1, 2021, on behalf of California Institute of Technology. Dispatch Date: Jul. 26, 2023. 5 Pages.

Notification of Reasons for Refusal issued for JP Application No. 2022-076165 filed on May 30, 2022, on behalf of California Institute of Technology. Dispatched on Feb. 21, 2023. JP Original and English Translation. 7 Pages.

Second Chinese Office Action for Chinese Application No. 201980067786.X filed on Apr. 14, 2021 on behalf of California Institute of Technology. Mail Date: Feb. 27, 2023. 8 Pages. English + Chinese.

Second Notification of Reasons for Refusal issued for JP Application No. 2022-076165 filed on May 30, 2022, on behalf of California Institute of Technology. Dispatched on Oct. 18, 2022. JP Original and English Translation.

Final Office Action issued for U.S. Appl. No. 16/777,491, filed Jan. 30, 2022, on behalf of California Institute of Technology. Mail date: Aug. 17, 2022. 18 Pages.

First Office Action + Search Report issued for Chinese Application No. 201980067786.X filed on Apr. 14, 2021, on behalf of California Institute of Technology. Issue Date: Aug. 3, 2022. Chinese Original + English Translation. 22 Pages.

Notification of Reasons for Refusal issued for Japanese Patent Application No. 022-076165 filed on May 30, 2022, on behalf of California Institute of Technology. Dispatch Date: Jul. 5, 2022. JP Original and English Translation. 7 Pages.

First Office Action issued for Chinese Patent Application No. 201980101356.5 filed on Oct. 18, 2019 on behalf of California Institute of Technology. Issue Date: Aug. 22, 2023. 10 pages. (English translation only).

Non-Final Office Action issued for U.S. Appl. No. 16/777,491, filed Jan. 30, 2022, on behalf of California Institute of Technology. Mail Date: May 4, 2022. 37 Pages.

Notice of Reasons for Refusal issued for Japanese Patent Application No. 2021-512844 filed on Mar. 8, 2021 on behalf of California Institute of Technology. Dispatch Date: Sep. 5, 2023. 13 pages. (English translation only).

Third Chinese Office Action issued for CN application No. 201980067786.X filed on Apr. 14, 2021 on behalf of California Institute of Technology. Issue Date: Sep. 14, 2023. 5 pages. English translation only.

Rejection Decision issued for CN Application No. 201980067786.X filed on Apr. 14, 2021 on behalf of California Institute of Technology. Mail Date: Jan. 2, 2024. Chinese + English translation. 9 pages.

(56) References Cited

OTHER PUBLICATIONS

Communication under Rule 71(3) EPC issued for EP Application No. 19909195.0 filed on May 20, 2021, on behalf of California Institute of Technology. Mail Date: Sep. 9, 2024. 45 Pages.

Li, Y., et al., "UV to NIR optical properties of IP-Dip, IP-L, and IP-S after two-photon polymerization determined by spectroscopic ellipsometry," Optical Materials Express, vol. 9, No. 11, Nov. 1, 2019. pp. 4318-4328 (11 pages).

Non-Final Office Action issued for U.S. Appl. No. 17/475,167, filed Sep. 14, 2021 on behalf of California Institute of Technology. Mail Date: Sep. 26, 2024. 43 pages.

Notice to File a Response issued for KR Patent Application 10-2022-7015534 filed on May 9, 2022 on behalf of California Institute of Technology. Mail Date: Aug. 27, 2024. English Translation and Korean Original. 10 pages.

P2404-USD 1.98(d) statement + List Jul. 24, 2024. 1 page.

Second Notice of Reasons for Refusal issued for Japanese Patent Applicaiton No. 2022-515969 filed on Oct. 18, 2019 on behalf of California Institute of Technology. Dispatch Date: Jan. 9, 2024. 6 pages. (English translation + Japanese Original).

Second Notice of Reasons for Refusal issued for Japanese Patent Application No. 2021-512844 filed on Mar. 8, 2021 on behalf of California Institute of Technology. Dispatch Date: Jan. 30, 2024. 14 pages. (English translation + Japanese Original).

\* cited by examiner

COLOR AND MULTI-SPECTRAL IMAGE SENSOR BASED ON 3D ENGINEERED MATERIAL

CROSS REFERENCE TO RELATED APPLICATIONS

The present application is a divisional of U.S. Non-Provisional application Ser. No. 16/656,156, filed on Oct. 17, 2019 for "Color and Multi-Spectral Image Sensor Based On 3D Engineered Materials", which claims priority to U.S. Provisional Application No. 62/748,677, filed on Oct. 22, 2018 for "Color and Multi-Spectral Image Sensor Based On 3D Engineered Materials" and U.S. Provisional Application. No. 62/776,685, filed on Dec. 7, 2018 for "Color and Multi-Spectral Image Sensor Based On 3D Engineered Materials", all of which are incorporated herein by reference in their entirety.

STATEMENT OF GOVERNMENT GRANT

This invention was made with government support under Grant No. HR0011-17-2-0035 awarded by DARPA. The government has certain rights in the invention.

FIELD

The present disclosure is related to multifunctional optical elements, and more particularly to multifunctional metamaterial devices formed by structuring the refractive index in a single block of material, such as a three-dimensional (3D) scattering structure, methods for producing such structure, and methods for splitting an electromagnetic wave in a plurality of electromagnetic waves.

BACKGROUND

Optical systems are typically designed via modular combinations of multiple elements to achieve complex functions. For example, lenses and diffractive optics can be combined to perform hyperspectral imaging. This approach is intuitive and flexible, providing access to a wide range of functions from a limited set of elements. However, the overall size and weight of the optical system may limit its scope of applications. Recent advancements in nanofabrication may alleviate this constraint by replacing bulky elements with metasurfaces planar arrays of resonant nanostructures with sub-wavelength thickness. By engineering the scattering of individual elements within the array, these devices can reproduce the multi-functionality of complex optical systems in a single element. However, efforts to combine multiple metasurfaces for more complex functionality have been stymied by reduced scattering efficiency, which scales inversely with the number of simultaneous tasks.

The inherent trade-off between multi-functionality and efficiency in these systems is due to the finite number of degrees of freedom, which scales with the volume of the device and the maximum refractive index contrast. In particular, this limits the range of independent functions achievable by any ultrathin system, such as sorting light according to frequency, polarization, and incident angle. By contrast, three-dimensional scattering elements with thicknesses greater than a wavelength commonly encode many simultaneous functions, albeit so far only with low efficiency due to weak scattering and low index-contrast.

Historically, optical design has been modular, a paradigm that provides an intuitive way to build and reconfigure optical setups. With the advancement of nanofabrication technologies it became possible to make structures with sub-wavelength feature size that enabled multi-functional optical elements combining the functionality of more complex setups. Examples include metasurface lenses that can split different polarizations and spectral bands. However, the degree of performance and functionality that can be achieved with metasurfaces and other planar structures is inherently limited by the number of optical modes that can be controlled.

Structuring the refractive index with high contrast at sub-wavelength scale provides an expansive optical design space that can be harnessed for demonstrating multi-functional optical elements. So far this has been used mostly in two dimensional structures, or metasurfaces. However, their performance is limited by the available optical degrees of freedom.

In order to highlight the benefits of the teachings of the present disclosure in the following sections, the example of image sensors is considered here. Currently, the majority of sensors record color using absorptive filters. FIG. 1 shows a prior art image sensor, wherein each four neighboring pixels has an absorptive color filter on top: two are for green, one for blue and one for red. The issue with such an image sensor is that the efficiency is limited to around 30%, as most of the light is absorbed.

The disclosed methods and devices address the described issues and provide solutions to the above-mentioned problems.

SUMMARY

The ultimate optical design space is a three-dimensional volume wherein the index of refraction can be controlled at will with spatial resolution smaller than the smallest relevant wavelength. In this case the number of degrees of optical freedom is enormous and can be used to realize completely non-intuitive multifunctional designs with high performance. The teachings of the present disclosure are based on such a concept.

The disclosed approach is based on designing three-dimensional scattering elements via iterative gradient-based optimization, while accounting for multiple target functions. The present methods and devices provide improvement upon existing optical devices by encoding various functionalities into the complex multiple-scattering within a volume, rather than at a single surface. The disclosed approach does not rely on local effective-medium assumptions or higher index contrast that are typical to metasurfaces, allowing efficient devices with coarse features above the diffraction limit. Embodiments in accordance with the present disclosure may also be fabricated wherein the standard multi-layer fabrication with modest requirements on feature size and number of layers may be used.

According to a first aspect of the present disclosure, a three-dimensional (3D) scattering structure formed into a set 3D pattern based on one or more set target functions is provided, wherein the 3D scattering structure is configured to: receive electromagnetic waves; and scatter the electromagnetic waves to provide the one or more set target functions.

According to a second aspect of the present disclosure, a method of splitting an electromagnetic wave into a plurality of waves with different wavelengths is disclosed, providing: applying the electromagnetic wave to a three-dimensional (3D) scattering structure at a first side thereof, the 3D scattering structure being formed into a set 3D pattern; and scattering off the electromagnetic wave to generate a plurality of electromagnetic waves with different wavelengths, the plurality of electromagnetic waves exiting the 3D scattering structure at output second side thereof.

Further aspects of the disclosure are provided in the description, drawings and claims of the present application.

DETAILED DESCRIPTION

Figure 2A:
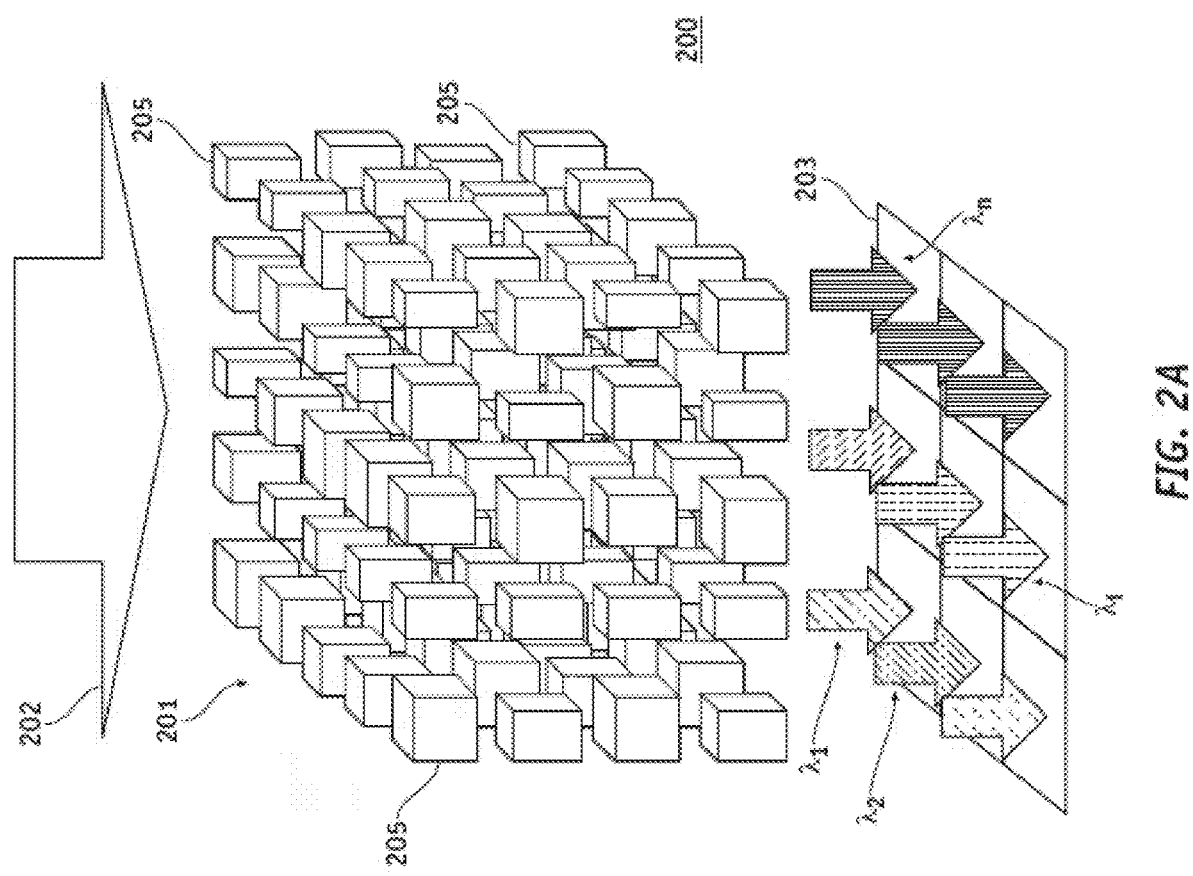
FIGS. 2A-2A' show exemplary three-dimensional (3D) scattering structures according to an embodiment of the present disclosure.
Figure 2A:
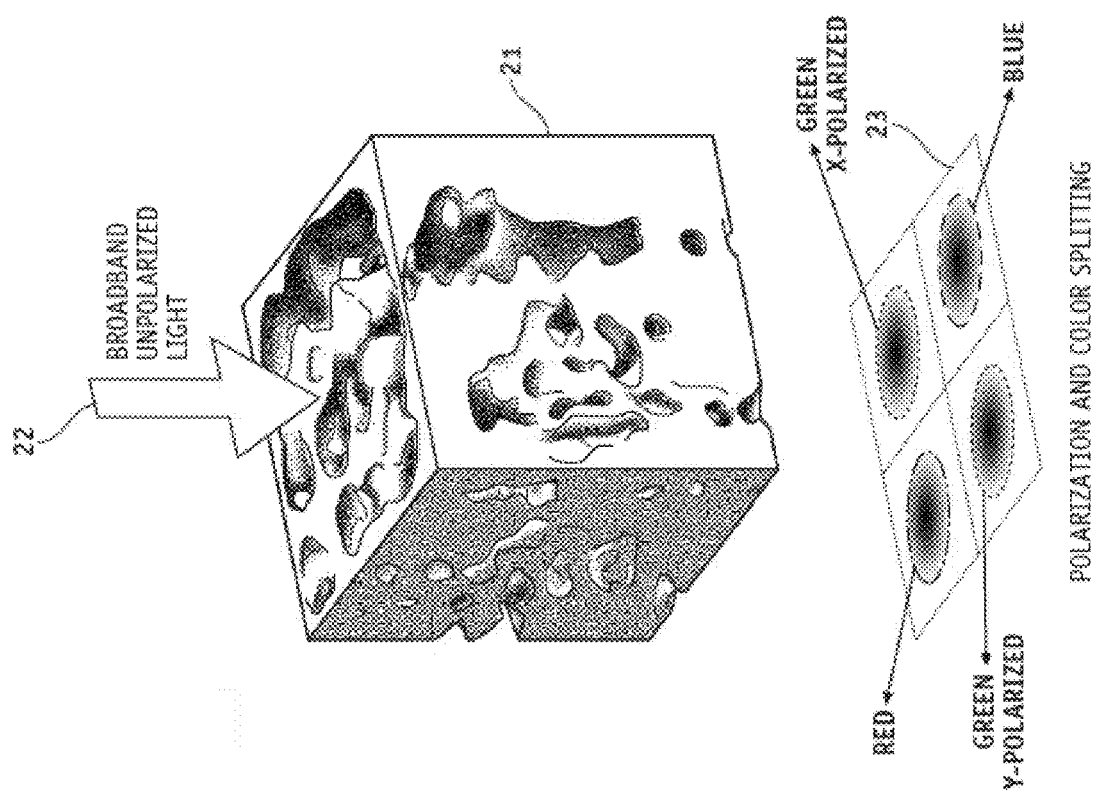

FIG. 2A shows an image sensor (200) according to an embodiment of the present disclosure. The image sensor (200) comprises a three-dimensional (3D) scattering structure (201) functioning as a spectrum splitter. The 3D scattering structure (201) comprises a plurality of dielectric pillars (205) formed to scatter light in a predefined pattern. Incident light (202) passing through the 3D scattering structure (201) is scattered off the dielectric pillars. Through arrangements of the dielectric pillars (205) in accordance with one or more target functions, the scattering pattern is tailored to perform a desired function. As an example, the 3D scattering structure (201) may be designed as a spectrum splitter to simultaneously sort and focus the incident light (202) into an arbitrary number of wavelengths ($\lambda_1, \ldots, \lambda_n$) each directed to an individual pixel on a focal plane (203) placed underneath the 3D scattering structure (201), as shown in FIG. 2A. In accordance with embodiments of the present disclosure, the 3D scattering structure (201) may be a porous polymer cube or a cluster of dielectric or semiconductor (silicon for example) particles embedded in a silica matrix.

Figure 1:
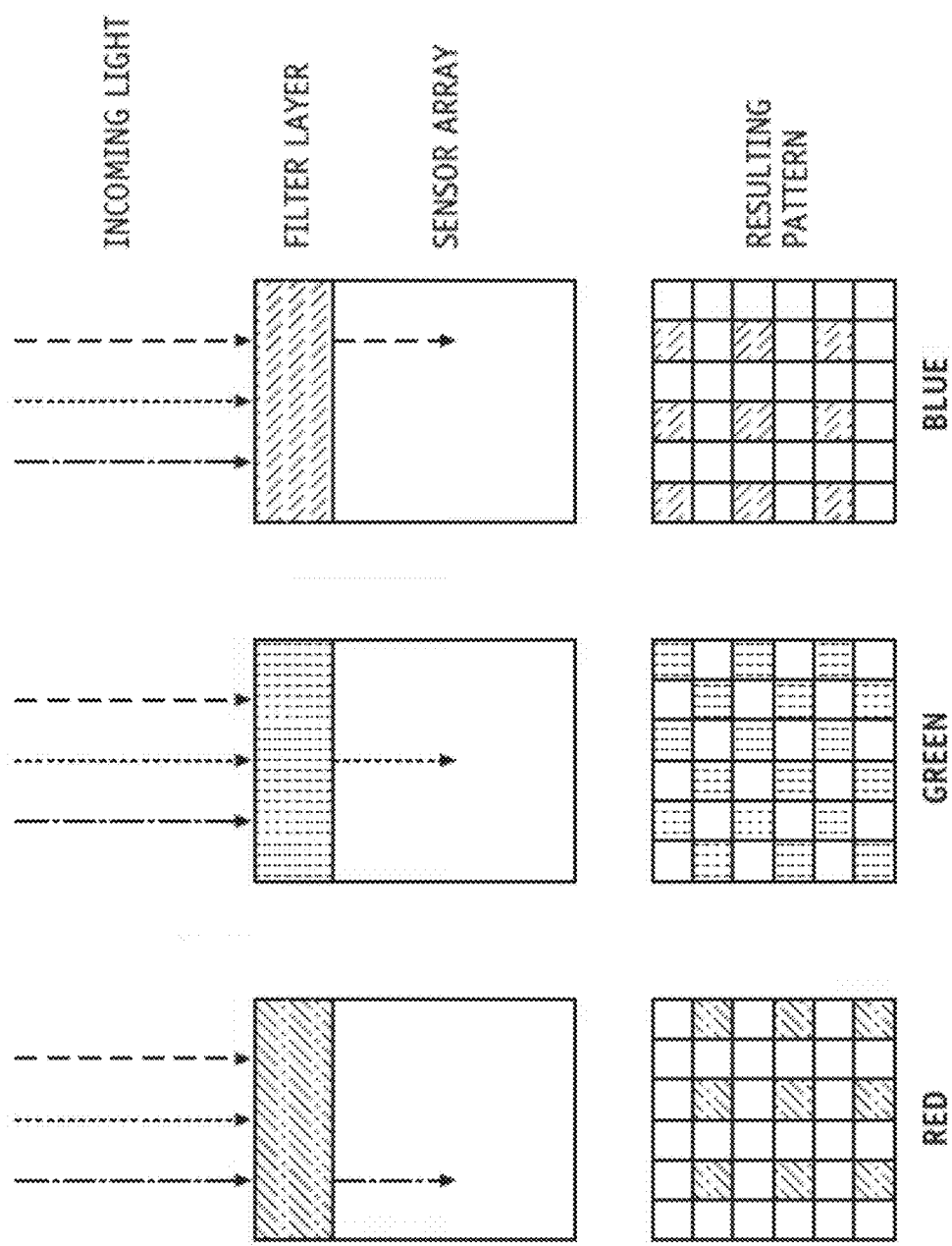
FIG. 1 shows a prior art image sensor.

The person skilled in the art will appreciate that, in contrast with the prior art image sensor (100) of FIG. 1, the image sensor (200) of FIG. 2A, does not function based on absorption and as such, it provides a substantial improvement of efficiency compared to existing solutions. This will be quantified later using exemplary embodiments of the present teachings. As also described more in detail throughout the disclosure, the disclosed devices and methods provide the following additional benefits over existing solutions:

The 3D scattering structure (201) of FIG. 2A may be manufactured through known lithographic processes.

The 3D scattering structure (201) of FIG. 2A may be designed to function as a spectrum splitter for arbitrary spectral bands such as infrared, mid-infrared or alike. In other words, in addition to hyperspectral imaging, thermal imaging is another potential application of the disclosed teachings.

The spectrum splitting function may be combined with other desired functions such as polarization splitting.

Embodiments according to the present disclosure may also be designed to perform optical image processing such as Gabor filtering for edge detection.

FIG. 2A' shows an image sensor (200') comprising an exemplary three-dimensional (3D) scattering structure (21) functioning as a spectrum filter, according to an embodiment of the present disclosure. Incident light (22) entering from the above, is scattered while passing through the 3D scattering structure (21) and sorted in a focal plane (23) consisting of four sub-pixels, shown as red, blue, green (x-polarized) and green (y-polarized). As also shown in FIG. 2A', the red (600 nm-700 nm) and blue (400 nm-500 nm) spectral bands are sorted into opposite quadrants. Moreover, the green (500 nm-600 nm) spectral band is further split according to linear polarization. The red and blue quadrants may be polarization independent.

In accordance with embodiments of the present disclosure, the 3D scattering structure (21) may be designed using an adjoint variable method, which generates a structure that optimizes a specified objective function. As an example, and referring to FIG. 2A', the objective function may be selected based on the focusing efficiency of incident light into one of four target areas depending on the frequency and polarization. Starting with an empty volume, full-wave finite-difference time-domain (FDTD) simulations are implemented to calculate the sensitivity of this figure of merit to perturbations of the refractive index. The prescribed scattering structure is formed and updated iteratively. In other words, the optimal design is generated through iterative updates to an initial geometry, each step improving the performance. The sensitivity may be calculated from just two simulations, allowing efficient optimization of 3D devices with modest resources. The sensitivity for multiple incident wavelengths across the visible spectrum may be calculated, to assign each spectral band to a different quadrant: red (600 nm-700 nm) green (500 nm-600 nm) and blue (400 nm-500 nm). Then a spectrally-averaged sensitivity may be used to update the refractive index of the device.

Figure 2B:
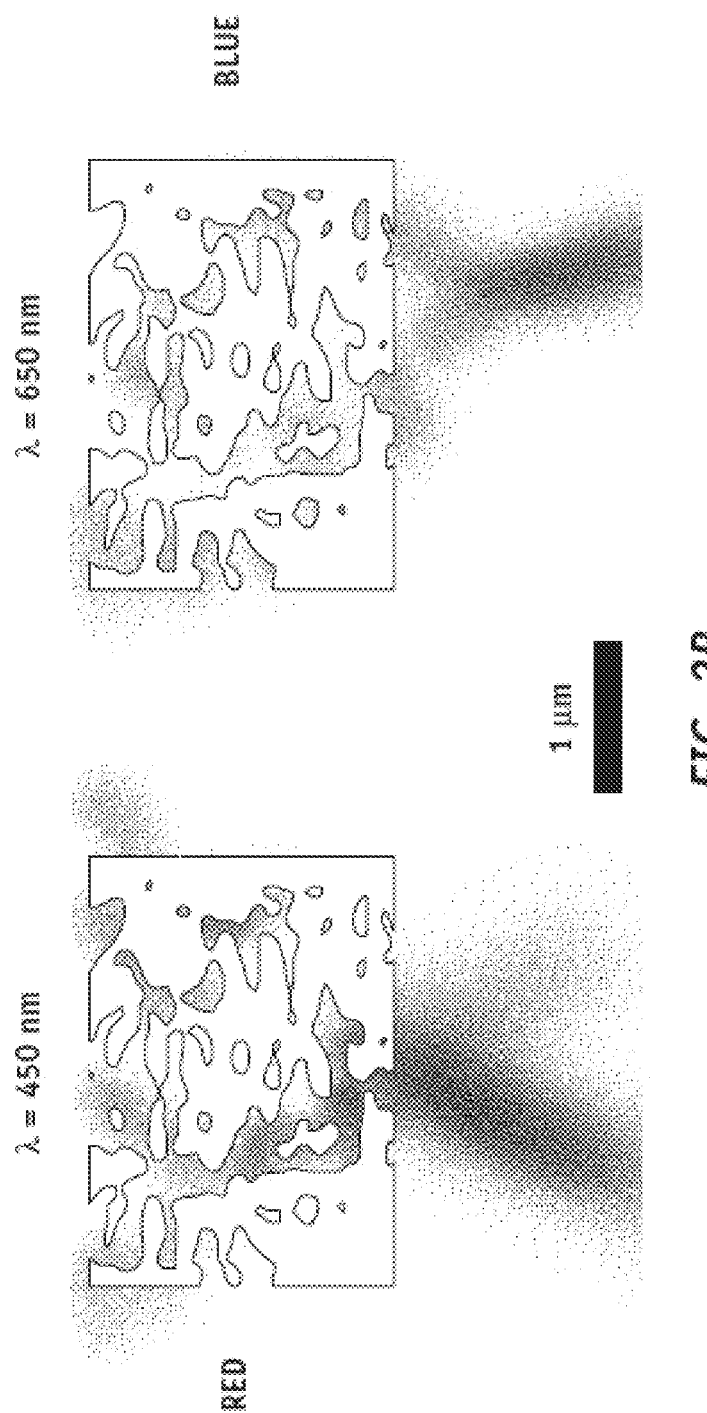
FIGS. 2B-2C show the wavelength splitting functionality of the embodiment of FIGS. 2A and 2A'.
Figure 2C:
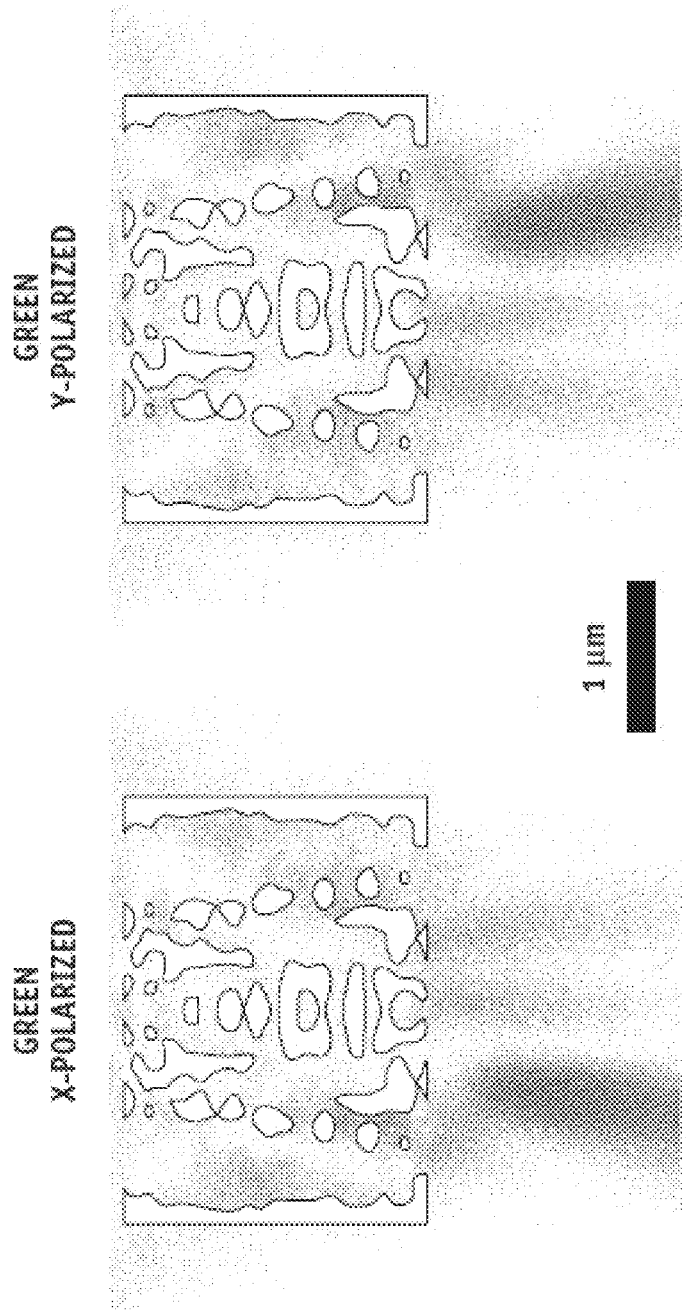

FIGS. 2B-2C show the simulated intensity of the incident light within the 3D scattering structure (21) of FIG. 2A'. The intensity is analyzed along a diagonal cross section that intersects the red and blue quadrants of FIG. 2A'. Each wavelength undergoes multiple scattering before converging its respective target region. FIG. 2C shows the intensity distribution of incident light within a diagonal cross-section through the green pixels for two orthogonal input polarizations. In both cases, a plane wave ($\lambda$=550 nm) incident from above is preferentially routed to the pixel corresponding to its polarization. Meanwhile, both polarizations are assigned the same region for red and blue spectral bands, maintaining the mirror symmetry of the objective function.

In accordance with an embodiment of the present disclosure, the 3D scattering structure (21) of FIG. 2A' sorts red, green, and blue light with 84%, 60% and 87% efficiency respectively. Throughout the present disclosure, the efficiency is defined as the fraction of the total power incident on the device that reaches the target quadrant averaging across the spectrum for which the device is designed for, i.e. the visible spectrum for the embodiment of FIG. 2A'.

With reference to FIGS. 2A, and 2A', the person skilled in the art will appreciate that the disclosed concept provides substantial flexibility in defining the target scattering function, with independent control for any incident polarization, angle, or frequency. However, complex three-dimensional structures present a significant challenge for fabrication. Large-scale implementation of these devices in image sensors at visible wavelengths will require high fabrication throughput with sub-100-nm resolution. This may be achieved by multi-layer lithography, where three-dimensional devices are constructed through repeated material deposition and patterning. Here, each layer consists of a series of patterned mesas composed of a high-index dielectric. The interstitial space is filled with a low-index dielectric, forming a flat surface that serves as a substrate for subsequent layers.

In order to further clarify the layered manufacturing approach discussed above, reference is made to FIGS. 3A and 3C illustrating a layered design of a 3D scattering structure (31) of FIG. 3C. In other words, the 3D scattering structure (31) of FIG. 3C may be structured by stacking the plural layers (301, . . . , 305) of FIG. 3A on top of one another. The fabrication process may be CMOS-compatible wherein the fabrication constraints may be directly incorporated with the design algorithm. Each layer (301, . . . , 305) may be produced using lithography. The 3D scattering structure (31) may be composed of TiO2 and SiO2, materials that are transparent at visible frequencies. The layers (301, . . . , 305) may be 2 um×2 um layers, each 400 nm tall. The person skilled in the art will understand that these are exemplary dimensions for description purposes, and that embodiments in accordance with the present disclosure, and with dimensions and numbers of layers other than those mentioned above may also be envisaged. As shown in FIG. 3B, each layer may comprise a set of irregular TiO2 mesas surrounded by SiO2. With reference to FIG. 3B', the lithography process may begin by growing a thin layer of dielectric (e.g. TiO2) on top of a substrate (e.g. SiO2). A pattern is transferred onto this layer by lithography and the unprotected material is etched away to reveal a two-dimensional dielectric structure. Finally, the surface is coated (deposition) with low-refractive index dielectric and mechanically polished (planarization). By repeating the same process for each layer and stacking up layers the desired 3D structure is produced. Such a lithography process provides flexibility in material design, and is compatible with industry-standard CMOS fabrication process, as noted above.

In what follows, some exemplary performance results associated with the disclosed devices will be shown.

Figure 3A:
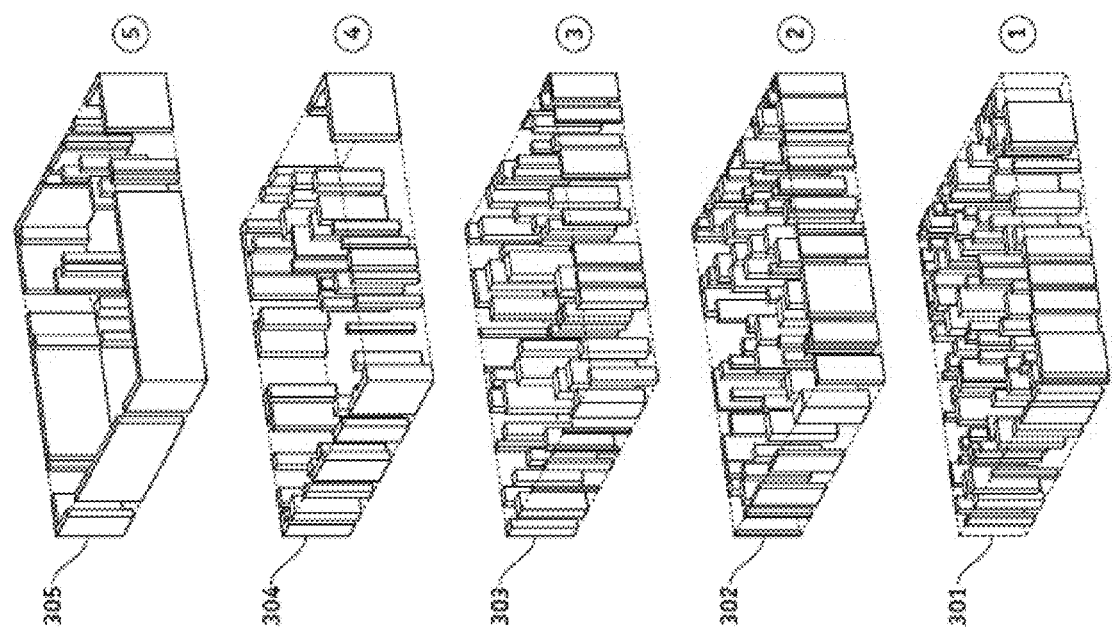
FIGS. 3A-3C show an exemplary three-dimensional (3D) scattering structure according to another embodiment of the present disclosure.
Figure 3B:
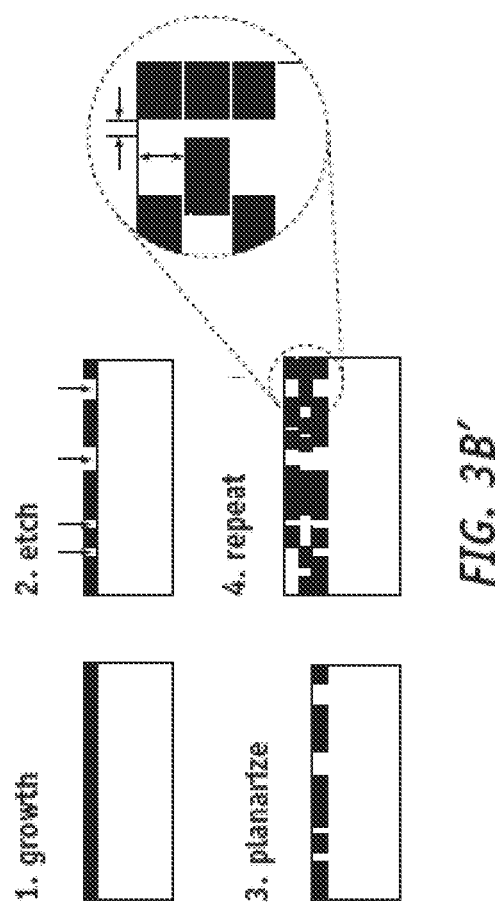
Figure 3B:
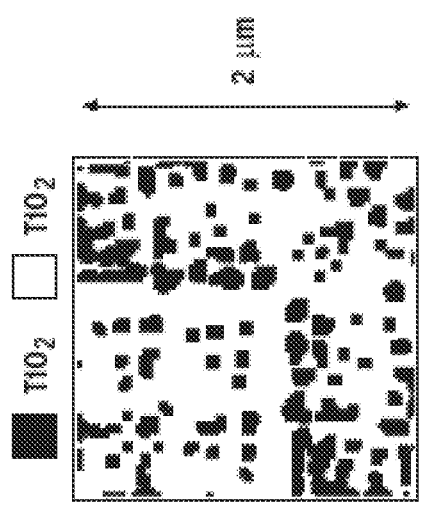
Figure 3C:
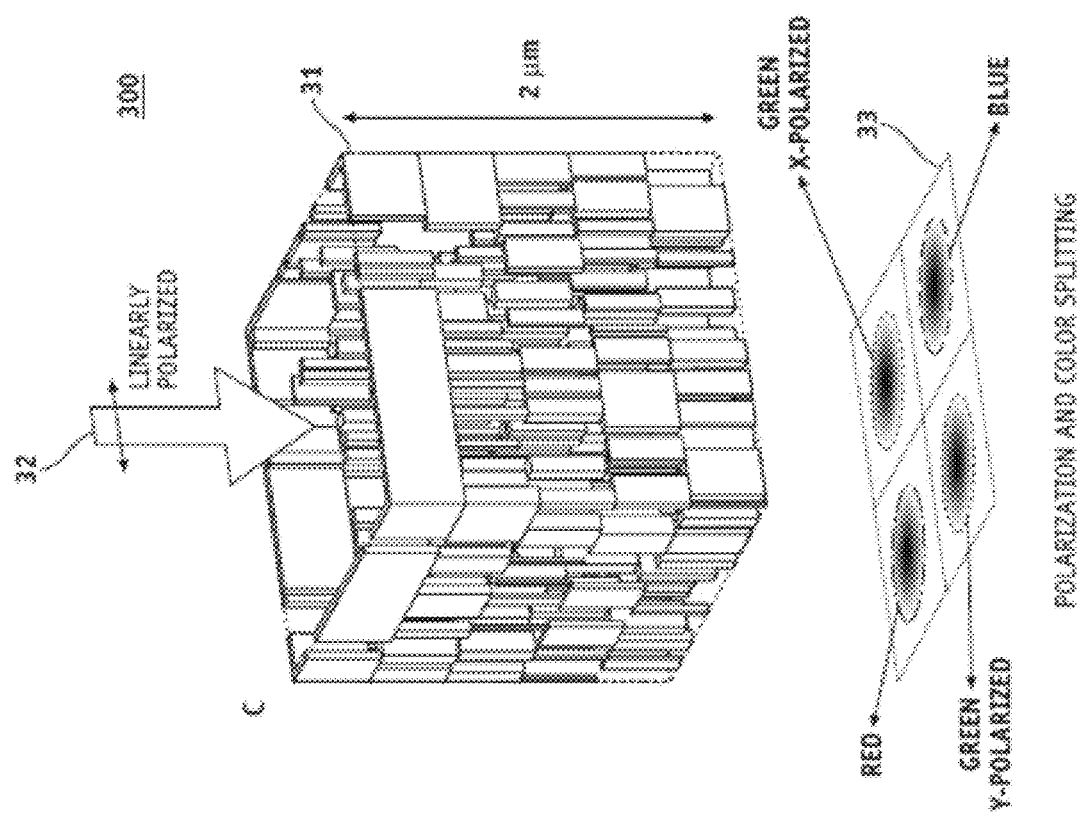

Similarly to what was described with regards to FIG. 2A', FIG. 3C shows an image sensor (300) including the 3D scattering structure (31) arranged on top of a focal plane (33) including four sub-pixels corresponding to red, blue, green (x-polarized), green (y-polarized), and arranged in a separate quadrant. Incident light (32) entering from the above, is scattered efficiently while passing through the 3D scattering structure (31) and sorted in the focal plane (33) into separate sub-pixels. The incident light (32) may be linearly polarized light, unpolarized light, or light with other states of polarization. Incident light is sorted on the image sensor based both on frequency, and polarization for some frequencies. When designing the 3D scattering structure (31), and to further demonstrate the practical aspects of the present teachings, a minimum feature size requirement of 60 nm may be set, so that the design may not contain small features that would not be amenable to a modest fabrication process.

Figure 4A:
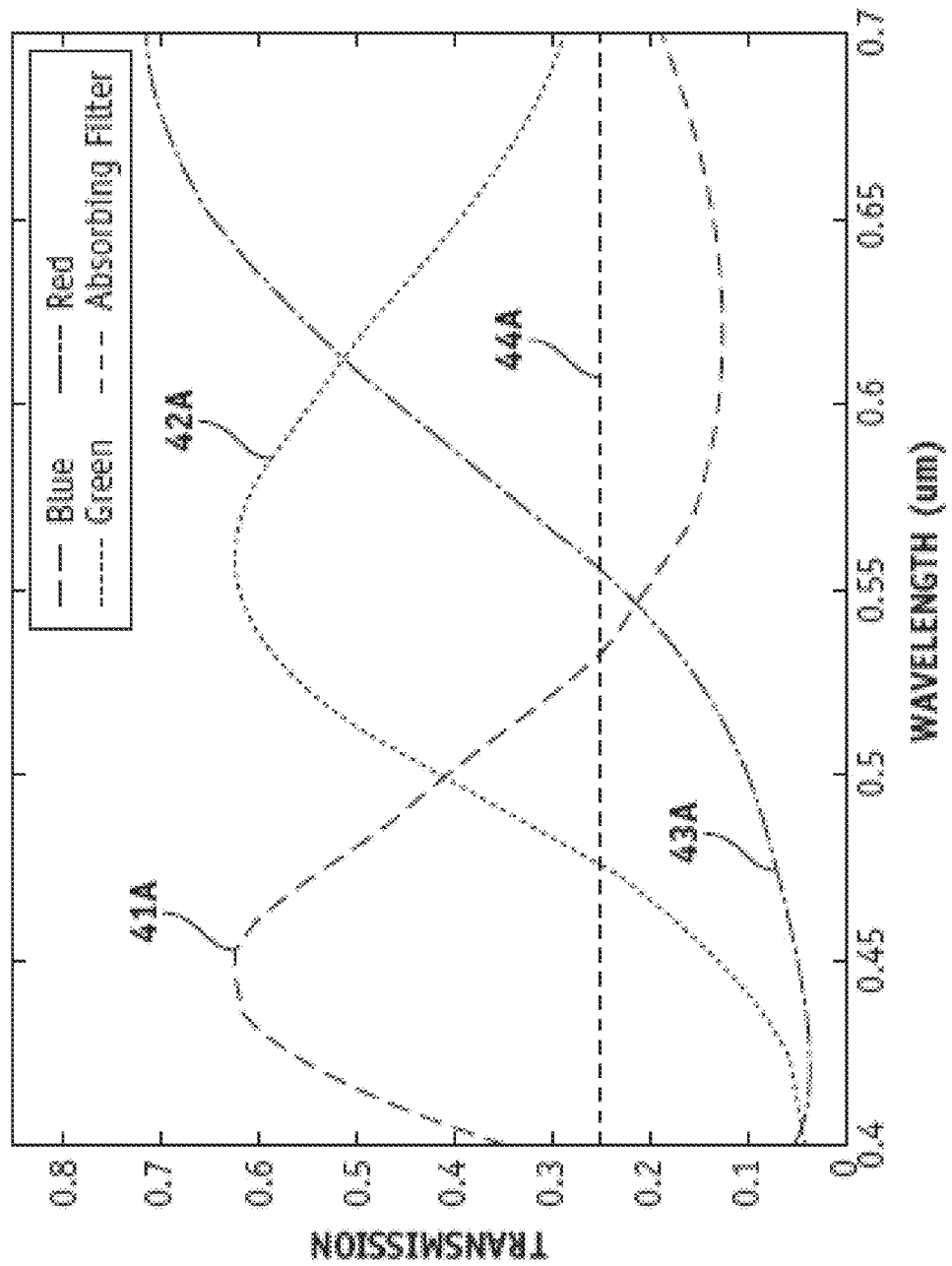
FIGS. 4A-4E shows performance results of exemplary embodiments in accordance with the present disclosure.

FIG. 4A shows exemplary transmission spectra related to the image sensor (300) of FIG. 3C. Graphs (41A, 42A, 43A) represent plots of transmission as a function of wavelength for colors (blue, green, red) respectively. Dotted line (44A) corresponds to the typical achievable results using prior art absorptive filters, as discussed with regards to FIG. 1.

Figure 4B:
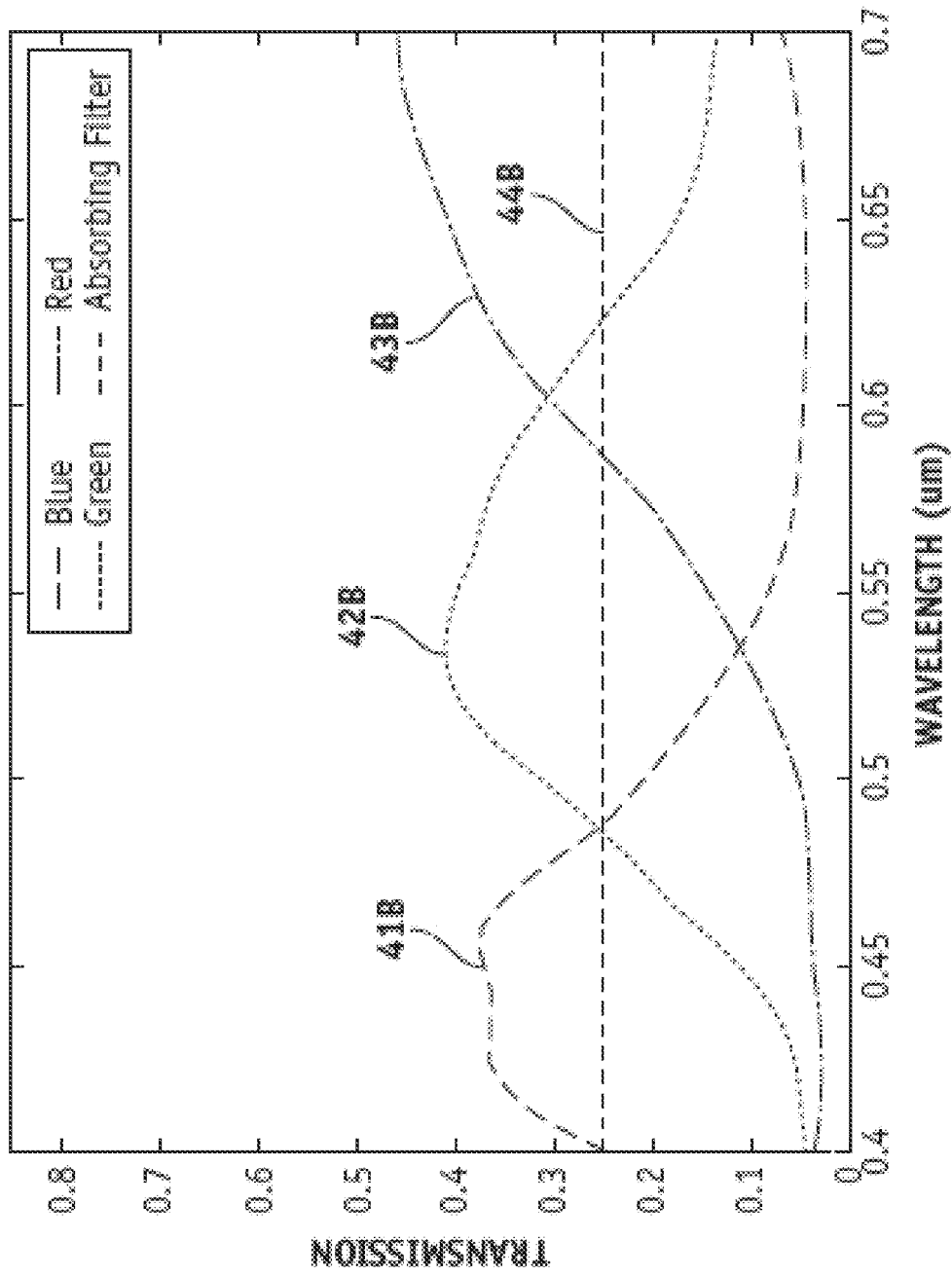

FIG. 4B shows exemplary transmission spectra related to the image sensor (300) of FIG. 3C, and when the incident plane of light is tilted by 3 degrees. Graphs (41B, 42B, 43B) represent plots of transmission as a function of wavelength for colors (blue, green, red) respectively. Dotted line (44B) corresponds to the typical achievable results using prior art absorptive filters, as discussed with regards to FIG. 1

Figure 4C:
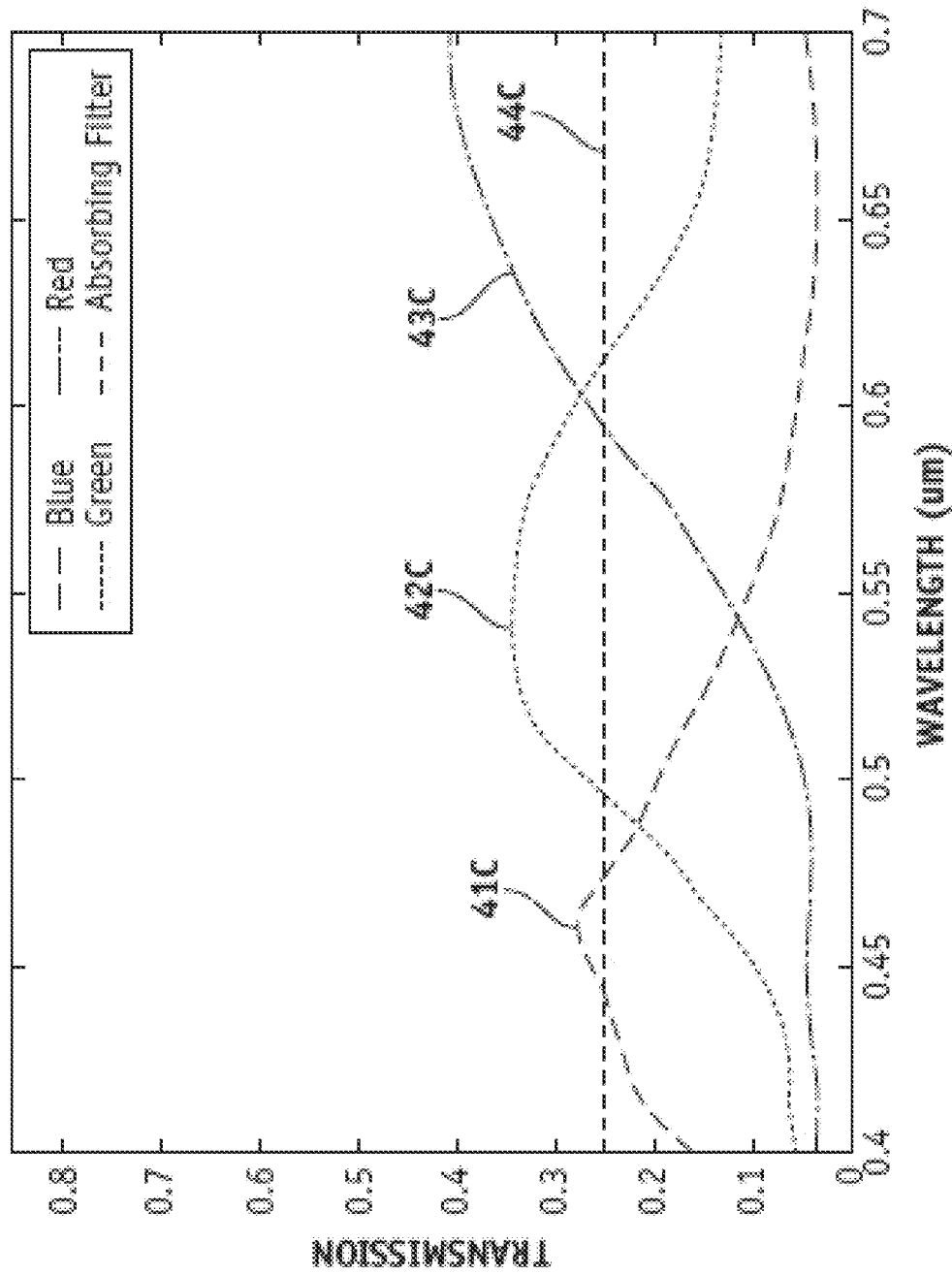

FIG. 4C shows exemplary transmission spectra related to the image sensor (300) of FIG. 3C, and when the incident plane of light is tilted by 6 degrees. Graphs (41C, 42C, 43C) represent plots of transmission as a function of wavelength for colors (blue, green, red) respectively. Dotted line (44C) corresponds to the typical achievable results using prior art absorptive filters, as discussed with regards to FIG. 1. The results shown in FIGS. 4B-4C are expected to be worse than those shown in FIG. 4A, as the 3D scattering structure (31) has not been optimized for any specific angle of incidence.

Figure 4D:
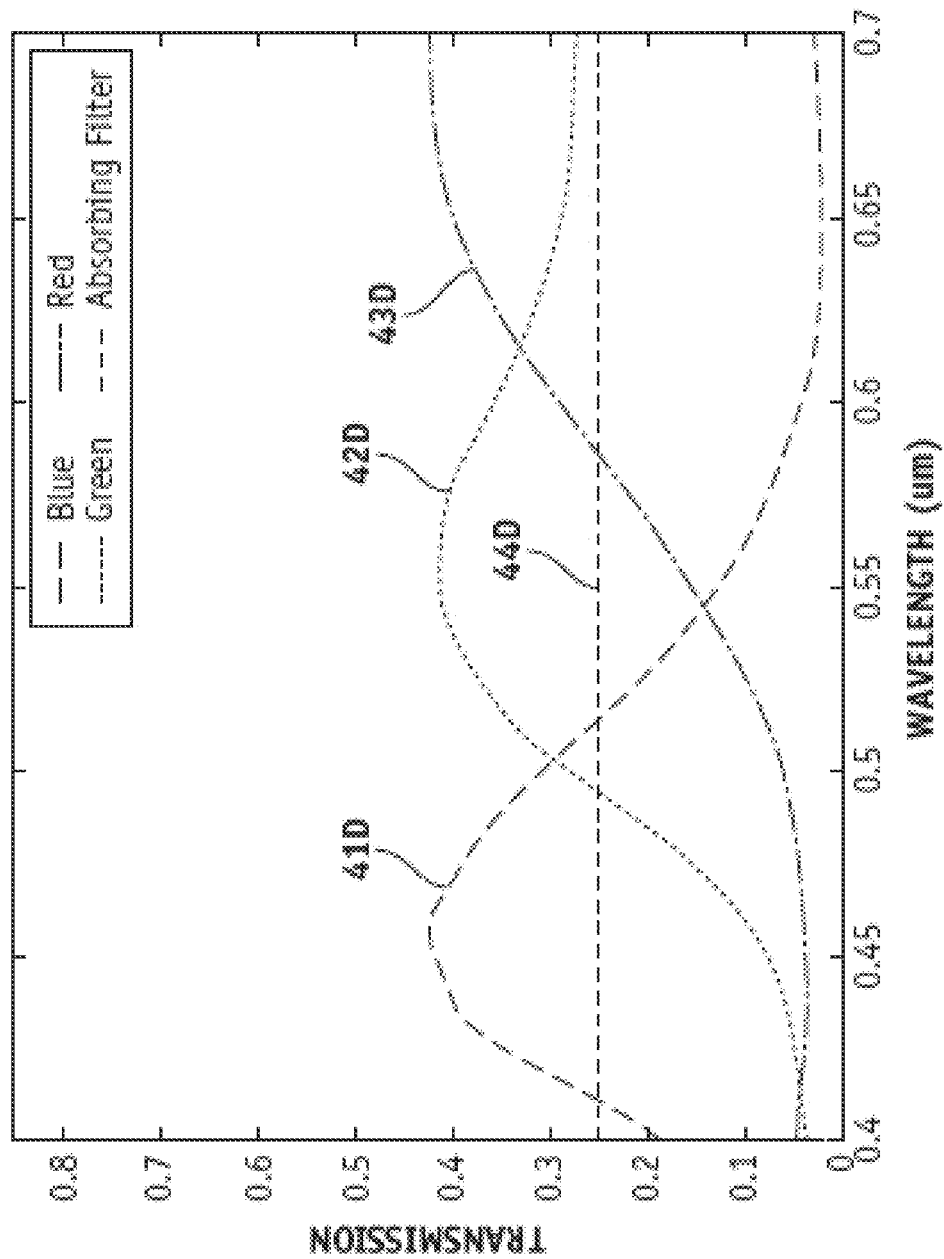

FIG. 4D shows exemplary transmission spectra related to the image sensor (300) of FIG. 3C, and when the incident plane of light is tilted by 20 degrees. In this case, the design has been optimized to take into account the 20 degree angle of incidence. Graphs (41D, 42D, 43D) represent plots of transmission as a function of wavelength for colors (blue, green, red) respectively. Dotted line (44D) corresponds to the typical achievable results using prior art absorptive filters, as discussed with regards to FIG. 1.

Throughout this document, in order to describe the disclosed methods and devices, exemplary planar waves have been used as input to the structures made in accordance with the teachings of the present disclosure. However, the person skilled in the art will appreciate that other devices in accordance with the embodiments of the present disclosure may also be made wherein the input can be waves other than planar waves. An example can be Gaussian beams. Structures applying different functions to different kinds of input beam profiles may also be envisaged. This is referred to as "spatial distribution" or "optical mode" throughout the document. There is a lot of diversity in mode profiles, which are defined by spatial distributions of both the amplitude and phase. Structures fabricated in accordance to the teachings of the disclosure may be linear devices, i.e. they can distinguish modes that are orthogonal.

In accordance to embodiments of the disclosure, 3D structures may be made wherein the sorting of the input electromagnetic waves may be based on 1) one or more wavelengths, 2) one or more polarizations, 3) an incident angle of the electromagnetic waves, 4) spatial distribution, or a combination thereof.

Figure 4E:
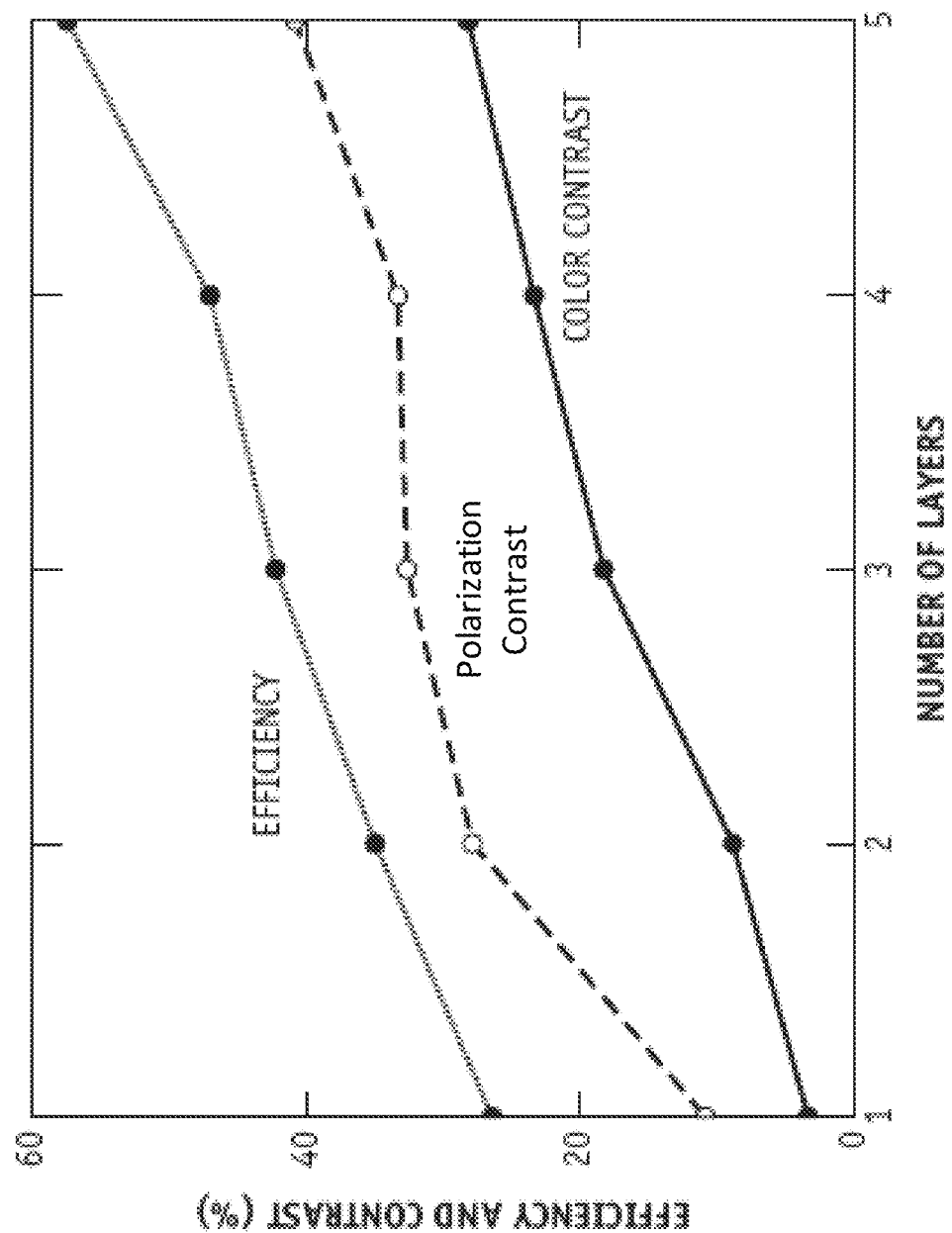

With further reference to FIGS. 3A-3C, the trade-off between multi-functionality and device thickness is being investigated by designing a series of 3D scattering structures with different numbers of layers. Each structure follows the same design algorithm using 400 nm layers, and as previously described regarding the embodiments of FIGS. 3A-3C. FIG. 4E shows the sorting efficiency, polarization contrast, and color contrast of each scattering structure, averaged across the visible spectrum. While the single-layer metasurface performs marginally better than empty space, efficiencies grow steadily with device thickness. In addition, thicker structures exhibit improved color and polarization contrast. Contrast is defined herein as the difference in normalized power between the two strongest quadrants, and therefore reflects the capacity to distinguish incident colors and polarizations. With five layers, the volumetric scattering element outperforms an absorptive filter with respect to sorting efficiency (58%), color contrast (28%), and polarization contrast (41%).

Microwave Frequencies

The Maxwell's equations are known to have scale invariance property, meaning that the behavior of any physical system when the wavelength and dimensions are scaled by a common factor is preserved. This fact was used to show constrained designs using large-scale analog operating at microwave frequencies. In order words, scattering devices, operating in the Ka band (26-40 GHz) with cm-scale dimensions may be implemented according to the teachings of the present disclosure.

Figure 5:
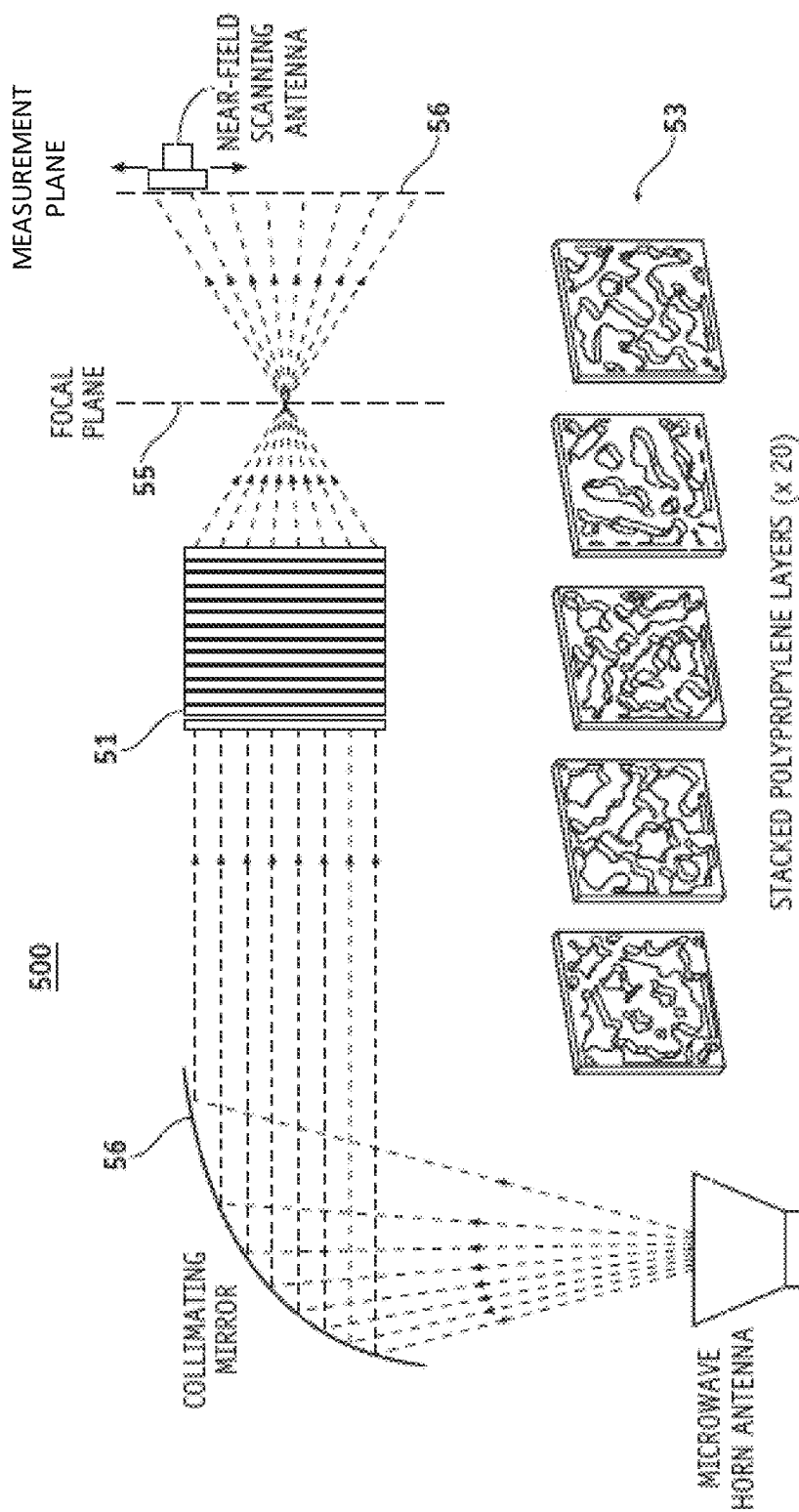
FIG. 5 shows an exemplary arrangement including a microwave 3D scattering structure in accordance with embodiments of the present disclosure.

FIG. 5 shows a microwave device (500) including a 3D scattering structure (51) functioning as a microwave filter. The 3D scattering structure (51) is constructed from a stack of 20 patterned polypropylene sheets (index=1.5), each 1.6-mm-thick, assembled into a cube. The minimum feature size may be restricted to 1 mm. A metallic boundary on the sides of the cube may also be incorporated in order to limit interference from the measurement apparatus. The microwave device (500) occupies a 35 mm×35 mm footprint, the same as its optical analog relative to the operating wavelength.

The performance of the 3D scattering structure (51) is characterized by measuring the complex microwave field scattered by the 3D scattering structure (51). In the example shown in the figure, the 3D scattering structure (51) is illuminated by a collimated Gaussian beam (full width half maximum, FWHM=25 mm), which is generated by a vector network analyzer (not shown) coupled to free space via a microwave horn antenna (52) and focusing mirror (56). As described previously, the input beam passes through the structure (51), scattering into the far field. The local electric field at a measurement plane (56) 62 mm beyond the output aperture of the 3D scattering structure (51) is measured using a WR-28 waveguide flange in order to recover the complex scattering amplitude S21. The measurements are then deconvolved and back-propagated to obtain the results at the focal plane (55).

This analysis is repeated for a range of microwave frequencies within the Ka band (26-40 GHz), and for both orthogonal polarizations of the input beam. To measure the scattering parameters for an orthogonal polarization, the 3D scattering structure is rotated by 90 degrees.

Figure 6:
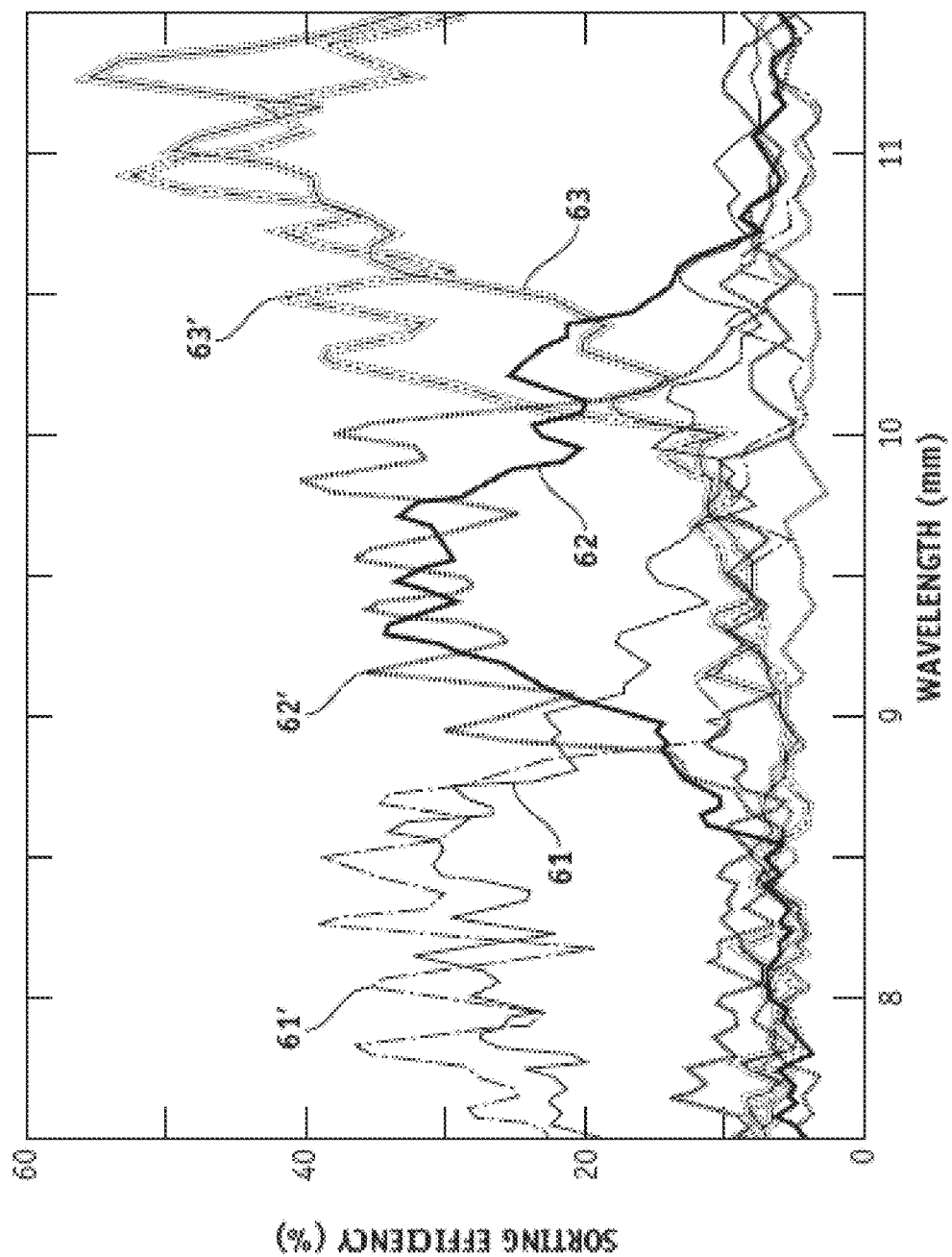
FIG. 6 shows exemplary performance results associated with the arrangement of FIG. 5.

FIG. 6 shows the simulated and measured intensity of the microwave fields at the focal plane (55) and for a certain polarization. Graphs corresponding to measurement results are shown in solid lines and those corresponding to simulation results are shown in dotted lines. The graphs shown in FIG. 6 represent the combined intensity for all frequencies within the measurement bandwidth, normalized to the total measured power at the focal plane for each frequency. The graph pairs (61, 61'), (62, 62'), and (63, 63') correspond to colors green, blue, and red respectively. The mentioned colors correspond to the observed hue of the analogous optical fields when the wavelength is scaled by a factor of 1.75×10^4. The Graphs shown represent the relative sorting efficiency of the 3D scattering structure (51) of FIG. 5 across the measurement spectrum. These efficiencies are defined as power transmitted through each target quadrant, normalized to the total power at the focal plane (55) of FIG. 5. Close agreement between experimental and simulated efficiencies is observed. Each band shows efficient sorting with low crosstalk from out-of-band light, roughly 10%. The sharp transitions between spectral bands highlight the improved color discrimination over typical dispersive scattering elements.

Referring back to FIGS. 3-5, as described previously, one method of manufacturing the disclosed devices may be to use multi-layer lithography. Embodiments in accordance with the present disclosure may also be constructed using a two-photon polymerization (TPP) approach, wherein the desired structure is directly printed. This approach is similar to 3D printing but it occurs at micro scale. As an example, a laser may be focused into the center of a liquid polymer, causing the polymer to cross-link and harden at the laser focus. By moving the laser focus, a three-dimensional structure with arbitrary geometries may be generated.

Optimization Algorithms

Gradient Descent

Referring back to FIGS. 2A'-3C, and as mentioned previously, three-dimensional dielectric structures, optimized to perform a target optical scattering function are designed according to the teachings of the disclosure. In the case of the exemplary embodiments shown in FIGS. 2A'-3C, such target scattering function consists of focusing incident plane waves to different positions depending on the frequency and polarization. The exemplary three-dimensional (3D) scattering structures (21, 31) are defined by a spatially-dependent refractive index distribution $n(\vec{x})$ within a cubic design region. This represents an expansive design space with the capacity to express a broad range of complex optical multi-functionality. However, identifying the optimal index distribution for a given target function remains a challenging inverse design problem, particularly for strongly scattering devices.

Figure 7:
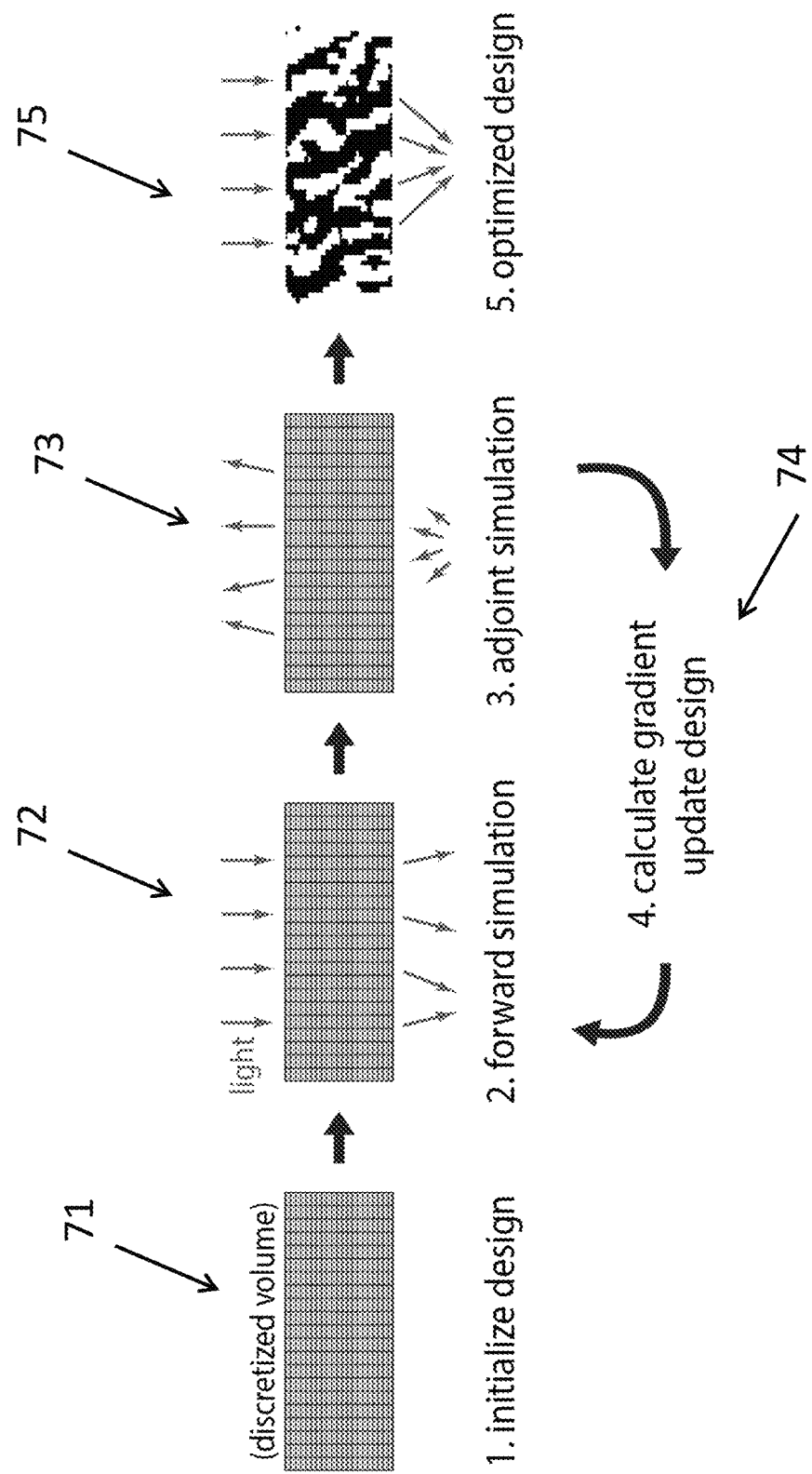
FIG. 7 shows multiple steps of an exemplary optimization algorithm in accordance with an embodiment of the present disclosure.

In order to overcome such challenge, and according to the teachings of the present disclosure, an iterative approach guided by gradient descent may be implemented, wherein starting from an initial index distribution, full-wave simulations (FDTD) is used to calculate the sensitivity of the focusing efficiency with respect to perturbations of the refractive index. The sensitivity may be calculated from just two simulations, allowing efficient optimization of three-dimensional devices with modest resources. Based on the sensitivity, the initial design is modified in order to maximize the performance while conforming to fabrication constraints. This update process is repeated until the optimized device can efficiently perform the target function In order to further clarify what is described above, reference is made to FIG. 7 showing multiple steps of a gradient based optimization algorithm in accordance with an embodiment of the present disclosure. The algorithm is initialized, step (81), with a uniform refractive index distribution, $$n_0(\vec{x}) = \frac{n_{max} + n_{min}}{2},$$

wherein $n_{max}$ and $n_{min}$ represent the maximum and minimum values of the refractive index respectively. This distribution is continually updated to maximize the electromagnetic intensity at the target location in focal plane, $f(n(\vec{x})) = |\vec{E}(\vec{x}_0)|^2$. This objective function serves as a proxy for focusing efficiency while simplifying the sensitivity calculation. The sensitivity, $$\frac{df}{dn}(\vec{x}),$$

is computed, step 74, from the electromagnetic fields in two FDTD simulations (forward and adjoint), steps (72, 73), according to the following expression:

$$\frac{df}{dn}(\vec{x}) = 2n(\vec{x})\text{Re}\{\vec{E}_{fwd} \cdot \vec{E}_{adj}\} \qquad (1)$$

where $\vec{E}_{fwd}$ are the electric fields within the cube when illuminated from above with a plane wave, step (72), and $\vec{E}_{adj}$ are the electric fields within the cube when illuminated from below, step (73) with a point source at the target location. The phase and amplitude of the point source are given by the electric field at the target location in the forward simulation. The sensitivity may be calculated for multiple incident wavelengths and polarizations across the visible spectrum, assigning each spectral band to a different quadrant: red (600 nm-700 nm) green (500 nm-600 nm) and blue (400 nm-500 nm). The spectrally-averaged sensitivity is then used to update the refractive index of the device, step (74), using the following formula:

$$n_{i+1}(\vec{x}) = n_i(\vec{x}) + \alpha \sum_\lambda \frac{df_\lambda}{dn}(\vec{x}) \qquad (2)$$

The step size $\alpha$ may be fixed at a small fraction (e.g., $\alpha=0.001$) to ensure that the change in refractive index can be treated as a perturbation in the linear regime. The sensitivity is recalculated after each update. After several iterations, the algorithm converges to the optimized design, step (75), wherein the resulting structure focuses incident light with the desired efficiency.

Fabrication Constraints

A. Binary Index

Figure 8:
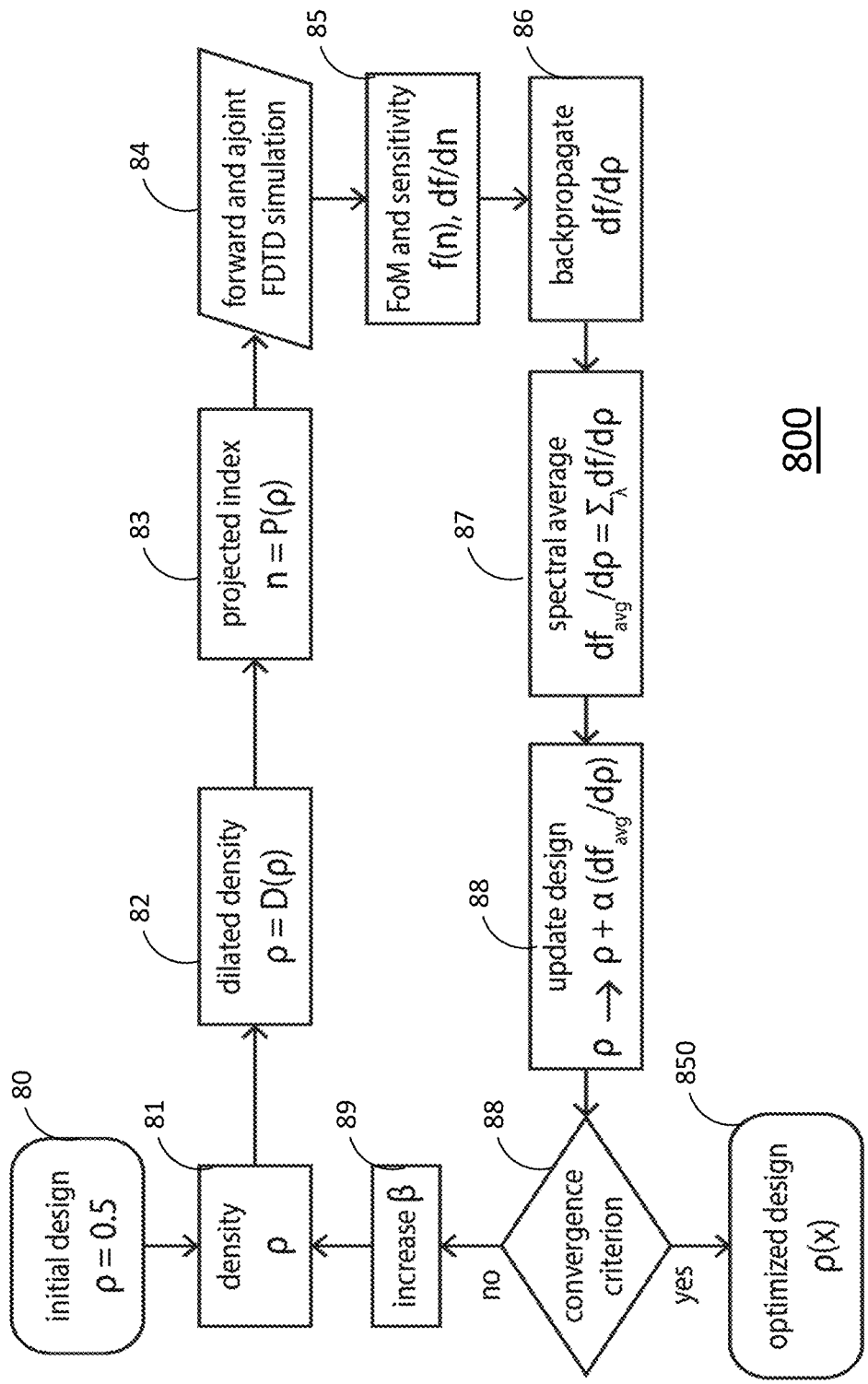
FIG. 8 show an exemplary flowchart illustrating various implementation steps of am optimization algorithm in accordance with further embodiments of the present disclosure.

During the optimization process, a set of constraints on the index distribution as required by the fabrication process may be enforced. According to embodiments of the present disclosure, high-contrast 3D scattering elements may be constructed from two materials. Although the gradient descent algorithm detailed above produces optimized devices with gradient index, the binary condition may be enforced by introducing an auxiliary density $\rho(\vec{x})$ ranging from [0,1]. FIG. 8 show an exemplary flowchart illustrating various implementation steps of a gradient based algorithm based on such concept and in accordance with further embodiments of the present disclosure.

With further reference to FIG. 8, the density $\rho(\vec{x})$ is first initialized. Such density is related to the refractive index distribution, steps (82, 83), via a sigmoidal projection filter:

$$n(\vec{x}) = P(\rho(\vec{x})) = \left(\frac{1}{2} + \frac{\tanh(2\beta\rho(\vec{x}) - \beta)}{2\tanh(\beta)}\right)(n_{max} + n_{min}) + n_{min} \qquad (3)$$

where the parameter $\beta$ controls the filter strength. For small $\beta$, the index distribution is equal to the density scaled to the range of available refractive index. For large $\beta$, the sigmoid filter approximates a Heaviside function, and the index distribution is pushed toward either extreme. Importantly, the filter function is continuously differentiable, such that the sensitivity can be written in terms of the density:

$$\frac{df}{d\rho} = \frac{df}{dn}\frac{dn}{d\rho}$$

as indicated in steps (85, 86). Similarly to what was described with regards to equation (2), the sensitivity may be calculated based on averaging across the desired spectral range, as indicated in step (87). During optimization, step (84), the design may be parametrized using the density $\rho(\vec{x})$ and $\beta$, gradually increasing the strength of the filter. At early stages of this iterative process, where $\beta$ is small, this is equivalent to the unfiltered case. Over time and with more number of iterations, as the strength increases, the optimized index distribution is gradually pushed toward a binary design, even as the density remains continuous. The density is updated in step (88) using the calculated sensitivity. The convergence criterion is then checked for in step (88). If such criterion is not met, then the parameter $\beta$ is increased, step (89), to update the density and the algorithm proceeds to the next iteration. If the convergence criterion is met at the current iteration, then the optimized design is achieved, as indicated by step (850).

B. Minimum Feature Size

In addition to material constraints described above, further embodiments in accordance with the present disclosure and conforming to the resolution limits imposed by the fabrication process may also be envisaged. For example, diffraction and proximity dosing effects limit electron beam lithography to approximately 10 nm features. This minimum feature size for device designs may be enforced by introducing a "dilated" density $\tilde{\rho}(\vec{x})$, which represents the maximum density $\rho(\vec{x}')$ within a neighborhood $\Omega$ of each point $\vec{x}$:

$$\tilde{\rho}(\vec{x}) = D(\rho(\vec{x})) = \sqrt[M]{\frac{1}{M}\sum_\Omega (\rho(\vec{x}'))^M} \qquad (4)$$

For a sufficiently large exponent M, this operation approximates morphological dilation. However it is continuously differentiable with respect to the arguments. Therefore, the sensitivity can be written in terms of the un-dilated density:

$$\frac{df}{d\rho(\vec{x})} = \sum_\Omega \frac{df}{d\tilde{\rho}(\vec{x}')}\frac{d\tilde{\rho}(\vec{x}')}{d\rho(\vec{x})}.$$

During optimization, the device is parameterized by the density $\rho(\vec{x})$, while the index is defined by the dilated density $\tilde{\rho}(\vec{x})$. The neighborhood $\Omega$ is taken to be a circle, where the radius represents the minimum feature size C. Connected Layers Design As discussed with regards to the embodiments shown in FIGS. 2A'-3C, Some of the device designs may be intended for fabrication by multi-layer 2D lithography, consisting of several patterned slabs that are invariant in the vertical direction. In such a case, the optimization may be restricted by averaging the calculated sensitivity in the vertical direction within each layer. In effect, voxels within each layer are governed by a shared 2D profile.

As another example, reference is made to the 3D scattering structure (51) of FIG. 5, wherein the design is further constrained so that each layer is fully connected with no floating pieces. Connectivity may be directly imposed by periodically adding bridges between disconnected islands within each layer. This intervention does not take sensitivity into account, and typically causes a small decrease in device performance. Therefore, connectivity constraint may be applied, for example, once per 40 iterations, allowing the performance to recover thereafter.

What is claimed is:

1. A method of splitting an electromagnetic wave into a plurality of waves with different wavelengths, the method comprising:

applying the electromagnetic wave to a three-dimensional (3D) scattering structure at a first side thereof, the 3D scattering structure being formed into a set 3D pattern;

scattering off the electromagnetic wave to generate a plurality of electromagnetic waves with different wavelengths, the plurality of electromagnetic waves exiting the 3D scattering structure at output second side thereof; and forming the 3D pattern using an optimization method employing a Gradient-based algorithm; wherein a target function of the Gradient-based algorithm is defined based on an electromagnetic intensity of the electromagnetic wave at target locations in a focal plane arranged outside the 3D structure;

a sensitivity of the target function with respect to a refraction index at a point within the 3D structure is calculated based on a sigmoidal projection filter, the filter having a parameter to control a strength of the sigmoidal projection filter, wherein the sensitivity of the target function is calculated by:

obtaining a uniform refraction index distribution based on an average of a maximum refraction index and a minimum refraction index;

applying the sigmoidal filter to the uniform refraction index distribution, to obtain a filtered refraction index;

adding the minimum refraction index to the filtered refraction index to obtain the refraction index at the point within the 3D structure, and increasing the strength of the sigmoidal projection filter from one iteration of the Gradient-based algorithm to another.

2. The method of claim 1, further comprising collecting each wave of the plurality of electromagnetic waves at a corresponding target area outside the 3D scattering structure.

3. The method of claim 2, wherein each target area corresponds to a sub-pixel of an image sensor.

4. The method of claim 1, further comprising, before the applying, building the 3D scattering structure by stacking up layers.

5. The method of claim 4, further comprising forming each layer by:

growing a dielectric layer above a substrate;
transferring a 2D pattern onto the dielectric layer; and
etching away an unprotected material.

6. The method of claim 1, further comprising, before the applying, building the 3D scattering structure by:

focusing a laser on a liquid polymer, thereby causing the liquid polymer to cross-link and harden at a laser focus; and moving the laser focus in accordance with an objective function of the Gradient-based algorithm.

7. The method of claim 1, wherein:

the sensitivity of the target function with respect to a refraction index at a point within the 3D structure is further calculated based on:

a first set of electric fields corresponding to a first simulated electromagnetic waves applied to the first side; and a second set of electric fields corresponding to a second simulated electromagnetic waves applied to the second side.

8. The method of claim 7, wherein the second simulated electromagnetic waves are generated via a point source at the focal plane.

9. The method of claim 1, further comprising enforcing a minimum feature size for the optimizing the 3D pattern with the Gradient-based algorithm.

10. The method of claim 9, wherein the enforcing the minimum feature size is based on a dilated density.

* * * * *